United States Patent [19]

Figura et al.

[11] Patent Number: 5,654,224

[45] Date of Patent: *Aug. 5, 1997

[54] CAPACITOR CONSTRUCTION WITH OXIDATION BARRIER BLOCKS

[75] Inventors: Thomas A. Figura; Paul J. Schuele, both of Boise, Id.

[73] Assignee: Micron Technology, Inc., Boise, Id.

[*] Notice: The term of this patent shall not extend beyond the expiration date of Pat. No. 5,464,786.

[21] Appl. No.: 686,386

[22] Filed: Jul. 25, 1996

Related U.S. Application Data

[63] Continuation of Ser. No. 447,750, May 23, 1995, Pat. No. 5,559,666, and a continuation of Ser. No. 328,095, Oct. 24, 1994, Pat. No. 5,464,786.

[51] Int. Cl.$^6$ .................... H01L 21/70; H01G 4/06
[52] U.S. Cl. .................... 438/396; 361/321.4; 438/3
[58] Field of Search ................... 437/47, 57, 60, 437/919, 200, 192; 361/321.1, 321.2, 321.3, 321.4, 321.5, 311–313; 257/295, 303, 306; 365/145, 149

[56] References Cited

U.S. PATENT DOCUMENTS

| | | | |
|---|---|---|---|
| 5,371,700 | 12/1994 | Hamada | 365/149 |
| 5,381,302 | 1/1995 | Sandhu et al. | 361/303 |
| 5,392,189 | 2/1995 | Fazan et al. | 361/305 |

*Primary Examiner*—Leo P. Picard
*Assistant Examiner*—Phuong T. Vu
*Attorney, Agent, or Firm*—Wells, St. John, Roberts, Gregory & Matkin, P.S.

[57] ABSTRACT

A method of forming a capacitor apparatus includes providing a substrate having a node, providing an electrically conductive reaction barrier layer with opposed recessed lateral edges over the substrate node, forming an inner capacitor plate, providing oxidation barrier blocks over the opposed recessed lateral edges, forming a dielectric layer and providing an outer capacitor plate.

14 Claims, 6 Drawing Sheets

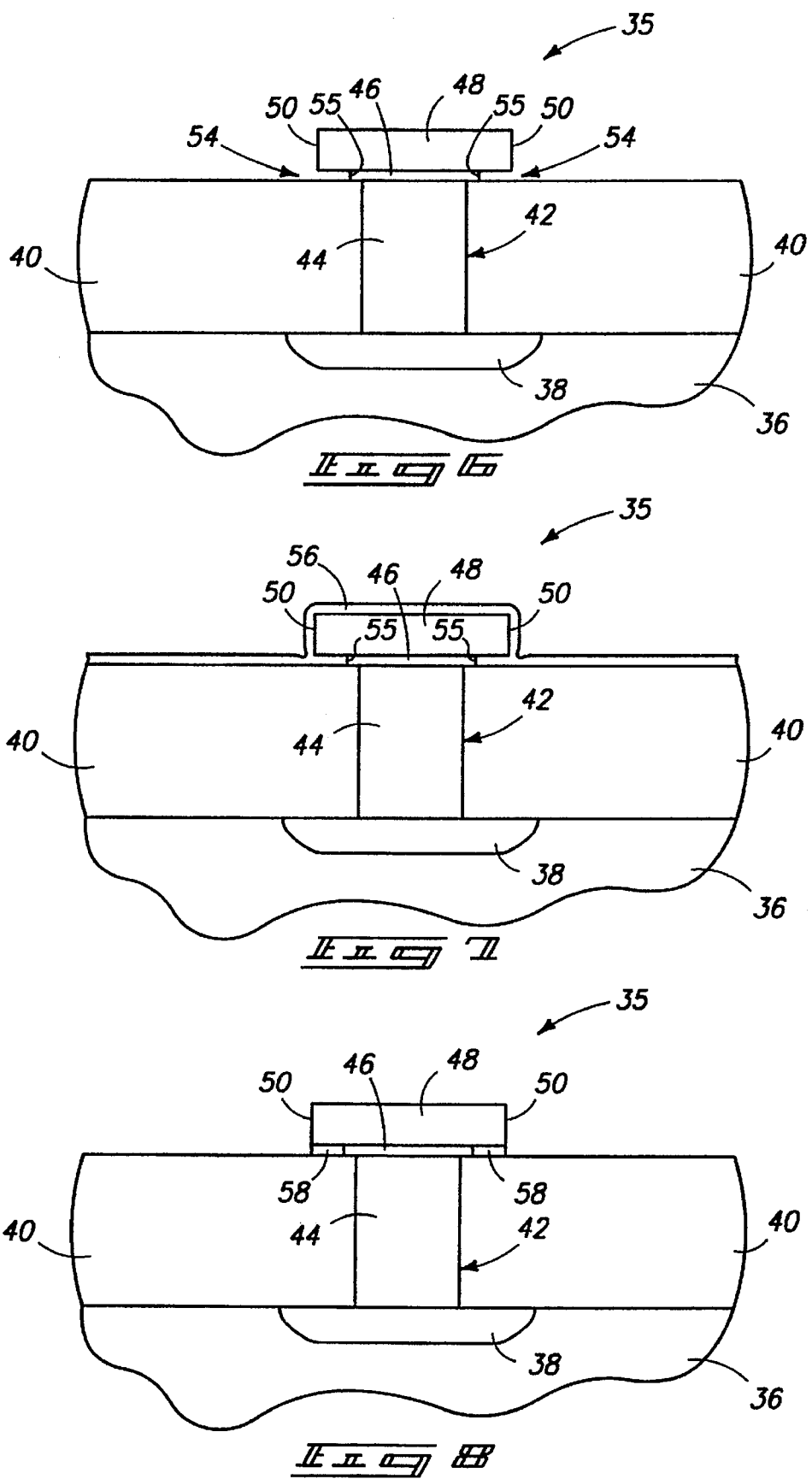

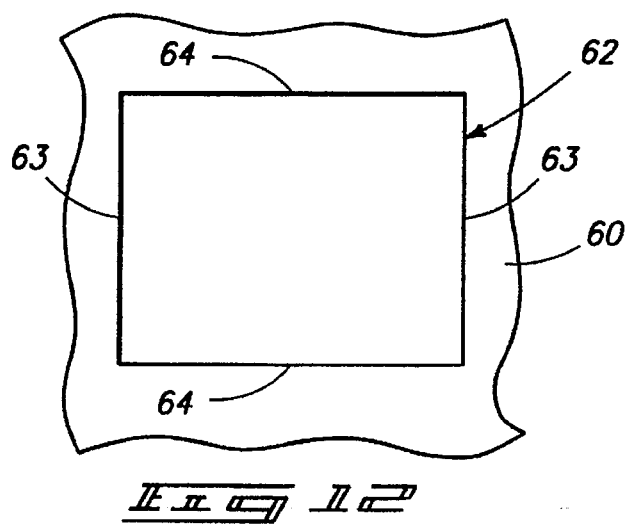
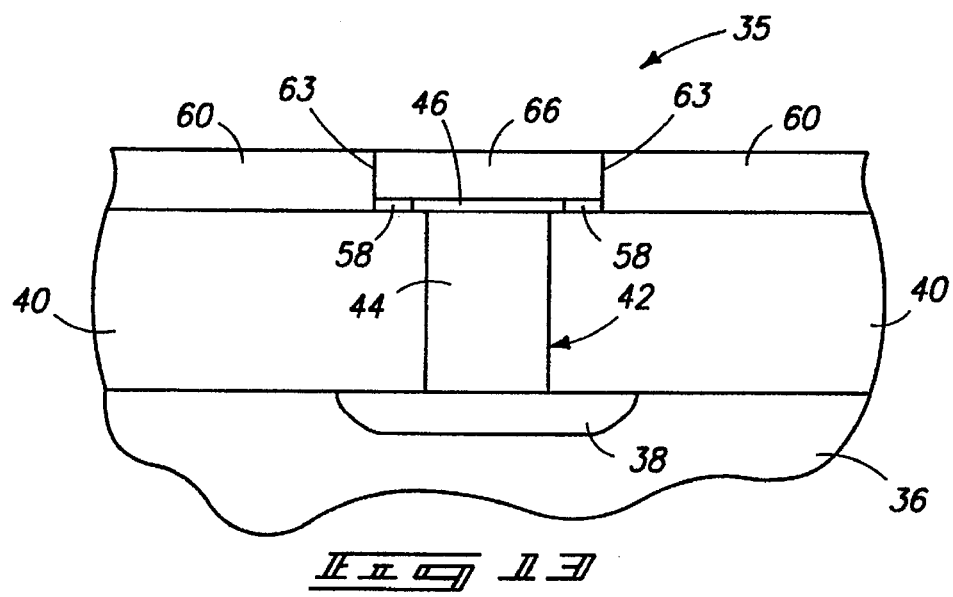
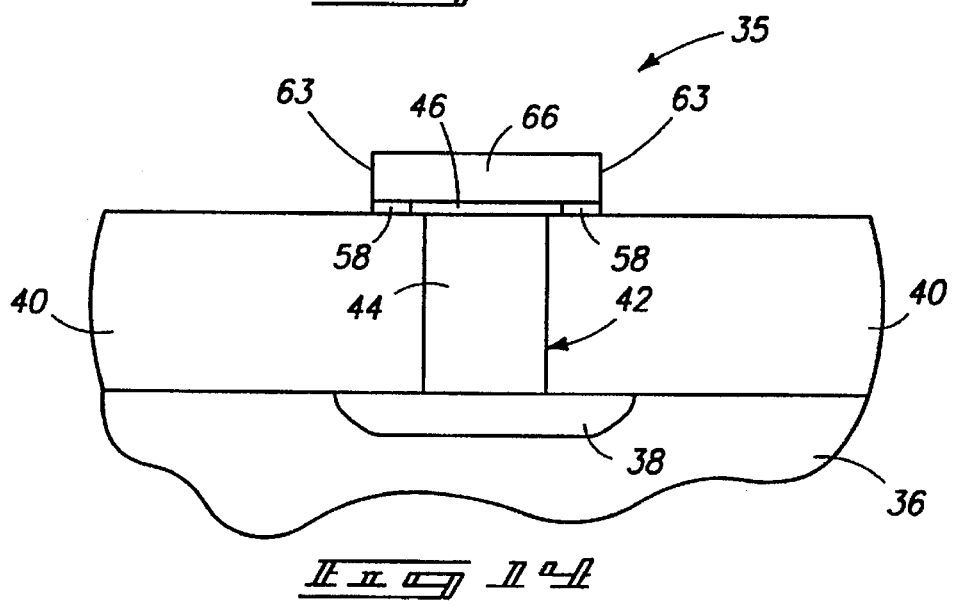

CAPACITOR CONSTRUCTION WITH OXIDATION BARRIER BLOCKS

RELATED PATENT DATA

The present application is a continuing application of application Ser. No. 08/447,750, filed on May 23, 1995, now U.S. Pat. No. 5,559,666 and which claims priority to U.S. patent application Ser. No. 08/328,095, filed on Oct. 24, 1994, now U.S. Pat. No. 5,464,786, issued on Nov. 7, 1995.

PATENT RIGHTS STATEMENT

This invention was made with government support under Contract No. MDA972-93-C-0033, awarded by Advanced Research Projects Agency (ARPA). The government has certain rights in the invention.

TECHNICAL FIELD

This invention relates to methods of forming capacitors and to capacitor constructions.

BACKGROUND OF THE INVENTION

The invention arose from concerns associated with undesired oxide formation in capacitors wherein the lower capacitor plate comprises platinum and the capacitor dielectric material is barium strontium titanate. A typical prior art construction is shown in FIG. 1, and includes a semiconductor wafer fragment indicated generally by reference numeral 10. Such comprises a bulk substrate 12 having associated source/drain areas 14 provided therewithin and a patterned electrically conductive word line 16 formed thereatop. An electrically insulating borophosphosilicate glass (BPSG) layer 18 is provided over substrate 12 and word line 16. A contact opening 20 is provided to extend downwardly to one of source/drain regions 14 for providing electrical connection relative to a capacitor. Contact opening 20 is filled with conductively doped polysilicon to form a plug 22.

A lower capacitor plate which makes electrical connection with polysilicon plug 22 is indicated with reference numeral 24, and preferably comprises Pt. It is desirable that the platinum of bottom storage node 24 not interface or interdiffuse with the silicon of plug 22. To prevent such diffusion and reaction, an electrically conductive reaction barrier layer 26, typically TiN is interposed between silicon plug 22 and platinum storage node 24. Subsequently, a thin capacitor dielectric layer 28 is provided over lower capacitor plate 24, followed by a final cell capacitor plate layer 30. An increasingly popular and desired material for capacitor dielectric layer 28 is barium strontium titanate.

The illustrated FIG. 1 construction is the desired ideal, although such does not practically occur during processing. Specifically and with reference to FIG. 2, the provision of TiN layer 26 in combination with a titanate layer such as barium strontium titanate, subjects layer 26 to undesired oxidation. Such results in formation of a wedge-shaped oxide layer 32 resulting from reaction of TiN to form titanium oxide. This actually causes platinum of storage node 26 to rise or wedge upwardly as shown. Such creates stresses and cracking as well as undesirably creating greater varying vertical topography.

It would be desirable to overcome such prior art problems in capacitor constructions.

BRIEF DESCRIPTION OF THE DRAWINGS

Preferred embodiments of the invention are described below with reference to the following accompanying drawings.

FIG. 6 is a view of the FIG. 3 wafer fragment at a processing step subsequent to that shown by FIG. 5.

FIG. 7 is a view of the FIG. 3 wafer fragment at a processing step subsequent to that shown by FIG. 6.

FIG. 8 is a view of the FIG. 3 wafer fragment at a processing step subsequent to that shown by FIG. 7.

FIG. 12 is an enlarged top view of FIG. 11.

FIG. 13 is a view of the FIG. 3 wafer fragment at a processing step subsequent to that shown by FIG. 11.

FIG. 14 is a view of the FIG. 3 wafer fragment at a processing step subsequent to that shown by FIG. 12.

DETAILED DESCRIPTION OF THE PREFERRED EMBODIMENTS

Figure 1:
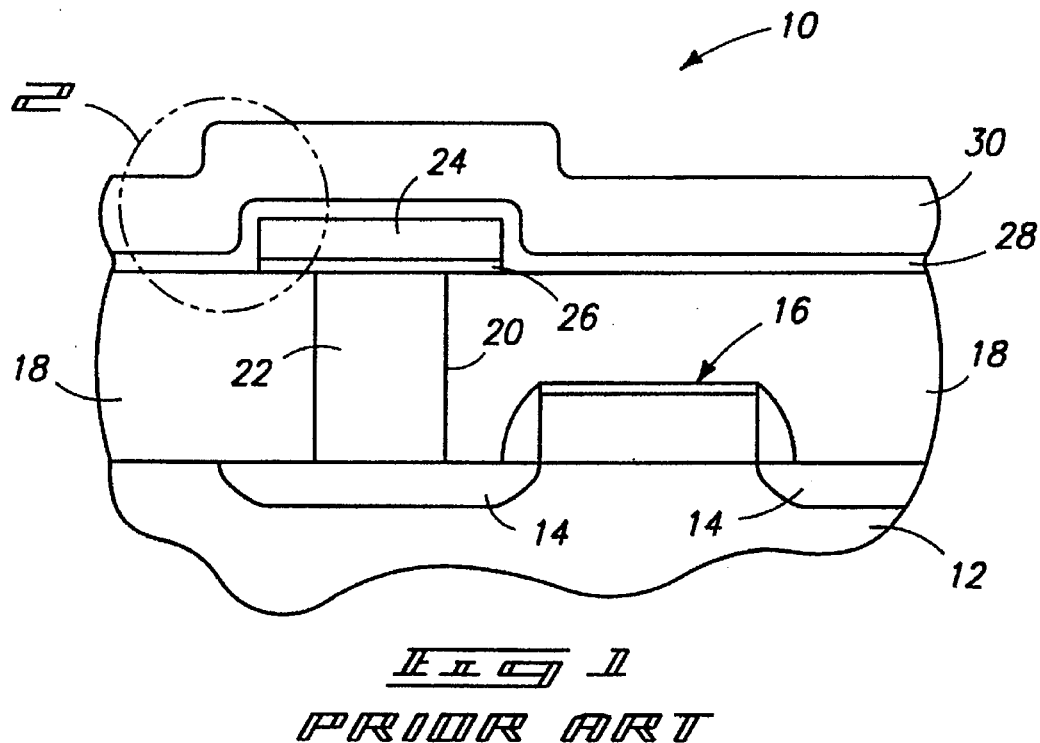
FIG. 1 is a diagrammatic sectional view of a theoretical prior art semiconductor wafer fragment, and is discussed in the "Background" section above.
Figure 2:
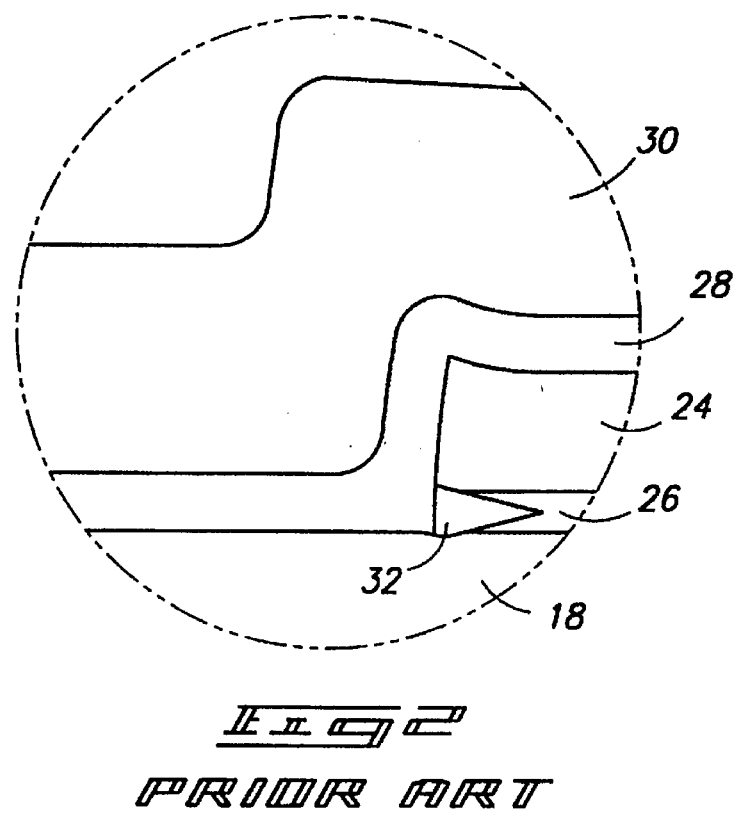
FIG. 2 is an enlarged view of a FIG. 1 wafer.
Figure 3:
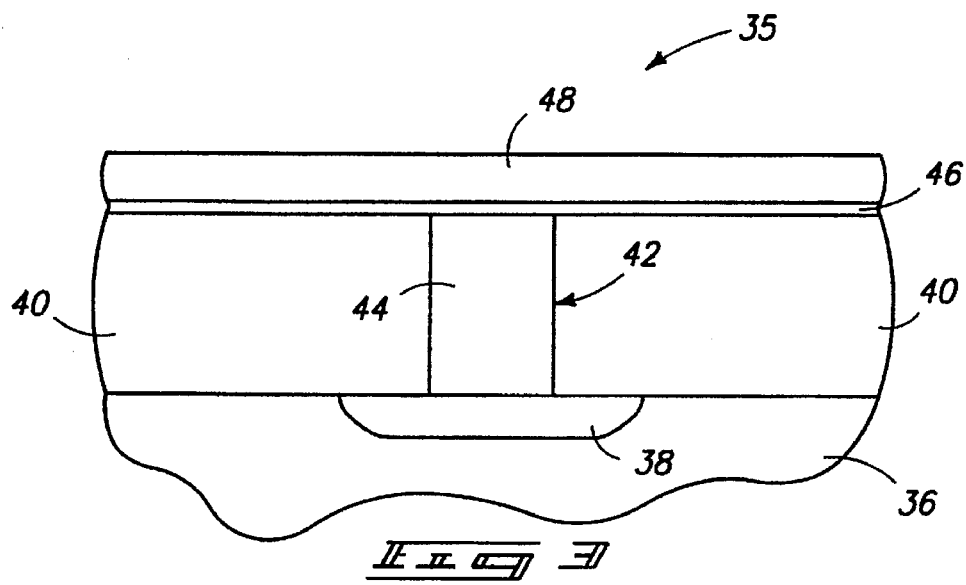
FIG. 3 is a diagrammatic sectional view of a semiconductor wafer fragment at one processing step in accordance with the invention.

This disclosure of the invention is submitted in furtherance of the constitutional purposes of the U.S. Patent Laws "to promote the progress of science and useful arts" (Article 1, Section 8).

In accordance with one aspect of the invention, a method of forming a capacitor comprises the following steps:

providing a substrate having a node to which electrical connection to a capacitor is to be made;

providing an electrically conductive reaction barrier layer over the substrate node;

providing a male molding layer over the reaction barrier layer;

etching the male molding layer into an external male shape having lateral confines corresponding to that of a desired finished lower capacitor plate shape;

etching the reaction barrier layer to form opposing lateral recesses beneath the etched male molding layer, the recesses defining opposing recessed lateral reaction barrier layer edges;

providing oxidation barrier blocks over the opposing recessed lateral reaction barrier layer edges;

providing a female molding layer over the etched male molding layer and oxidation barrier blocks;

etching back the female molding layer to outwardly expose the etched male molding layer;

stripping the exposed etched male molding layer from the substrate to leave a female mold having lateral confines corresponding to that of a desired finished lower capacitor plate shape;

providing electrically conductive material within the female mold;

stripping the female molding layer from the substrate to leave a block of the electrically conductive material corresponding in lateral shape to that of a desired finished lower capacitor plate shape; and providing a capacitor dielectric layer and a cell capacitor layer over the electrically conductive block.

In accordance with another aspect of the invention, a method of forming a capacitor comprises the following steps:

providing a substrate having a node to which electrical connection to a capacitor is to be made;

providing an electrically conductive reaction barrier layer over the substrate node;

providing an electrically conductive lower capacitor plate layer over the reaction barrier layer;

etching the lower capacitor plate layer into an external shape having lateral confines corresponding to that of a desired finished lower capacitor plate shape;

etching the reaction barrier layer to form opposing lateral recesses beneath the etched lower capacitor plate layer, the recesses defining opposing recessed lateral reaction barrier layer edges;

providing oxidation barrier blocks over the opposing recessed lateral reaction barrier layer edges; and providing a capacitor dielectric layer and a cell capacitor layer over the etched lower capacitor plate layer.

In accordance with still a further aspect of the invention, a capacitor apparatus comprises:

a substrate having a node;

an inner capacitor plate in ohmic electrical connection with the substrate node;

an outer capacitor plate;

a capacitor dielectric layer interposed between inner and outer capacitor plates;

an electrically conductive reaction barrier layer interposed between the substrate node and the inner capacitor plate, the reaction barrier layer having outer lateral edges which are recessed beneath the inner capacitor plate; and oxidation barrier blocks being received over the recessed outer lateral edges beneath the inner capacitor plate.

More particularly and with reference to FIGS. 3–15, a semiconductor wafer fragment at one processing step in accordance with the invention is indicated generally by reference numeral 35. Such comprises a bulk substrate 36 having a conductively doped diffusion region 38. A planarized layer 40 of insulating material, such as borophosphosilicate glass (BPSG), is provided atop substrate 36. A contact opening 42 is etched through insulating layer 40 inwardly to active diffusion region 38. Contact 42 is filled with an electrically conductive material 44, preferably polysilicon. Plug 44 constitutes a node to which electrical connection to a capacitor is to be made. An electrically conductive reaction barrier layer 46 is provided atop planarized insulating layer 40 over node 46. An example and preferred material is TiN deposited to a thickness of 1000 Angstroms. A male molding layer 48 is provided over reaction barrier layer 46. Such is preferably deposited to a thickness equalling the desired final thickness of a lower capacitor storage plate. An example preferred material is polysilicon.

Figure 4:
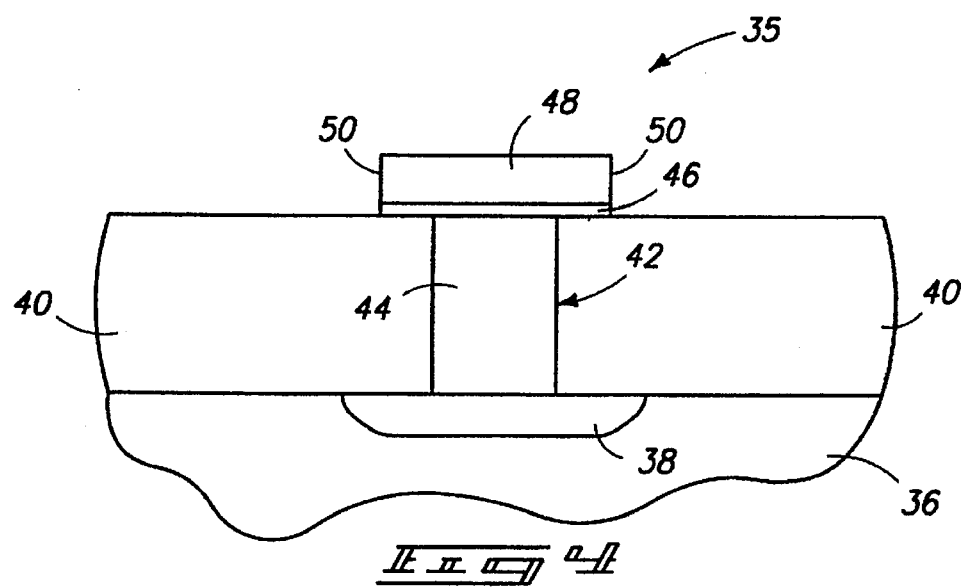
FIG. 4 is a view of the FIG. 3 wafer fragment at a processing step subsequent to that shown by FIG. 3.
Figure 5:
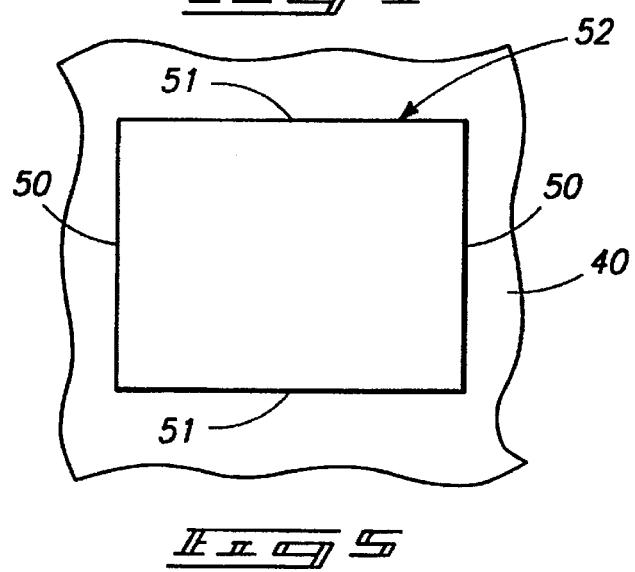
FIG. 5 is an enlarged top view of FIG. 4.

Referring to FIGS. 4 and 5, male molding layer 48 is etched into an external male shape having opposed lateral confines or lateral edges 50 which correspond to that of a desired finished lower capacitor plate shape. Reaction barrier layer 46 is also etched as shown using the same photomask. Example etching chemistry for polysilicon would include fluorine, bromine or chlorine containing gases. For TiN, gases utilized would typically be fluorine or chlorine. Preferably, the step of etching the male molding layer comprises etching said layer into an external male shape which corresponds completely to the external edge confines of the finished lower capacitor plate shape, to provide adjacent and opposed edges 51 (FIG. 5). Accordingly, FIG. 5 illustrates an external male shape 52 which corresponds completely to the external edge confines of the desired finished lower capacitor plate.

Referring to FIG. 6, reaction barrier layer 46 is etched to form opposing lateral recesses 54 beneath etched molding layer 48. Such defines opposing recessed lateral reaction barrier layer edges 55. Ideally, the etch to produce recesses 54 positions lateral reaction barrier layer edges 55 laterally outward away from the node defined by plug 44. Example etch chemistry for producing recesses 54 where reaction barrier layer 45 comprises TiN are $H_2O_2$ and $H_2SO_4$ at a 10:1 ratio by volume, or pure $H_2O_2$.

Referring to FIG. 7, an oxidation barrier material layer 56 is deposited over the substrate and to within recesses 54 over opposing recessed lateral reaction barrier layer edges 55. Such a deposition is highly conformal to cover edges 55, with an example preferred deposition material being $Si_3N_4$. Also preferably as will be described subsequently, layer 56 preferably comprises a dielectric material.

Referring to FIG. 8, layer 56 is etched to define oxidation barrier blocks 58. Example and preferred etching conditions to produce the construction of FIG. 8 include either wet hot phosphoric acid or an isotropic dry etch using a fluorine containing gas.

Figure 9:
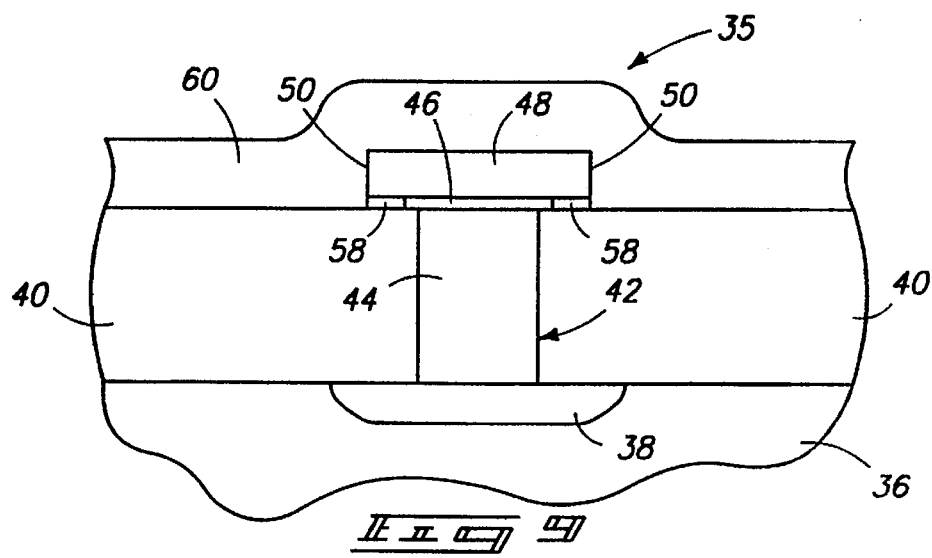
FIG. 9 is a view of the FIG. 3 wafer fragment at a processing step subsequent to that shown by FIG. 8.

Referring to FIG. 9, a female molding layer 60 is provided over etched male molding layer 48 and over oxidation barrier blocks 58. An example and preferred material is an oxide, such as BPSG.

Figure 10:
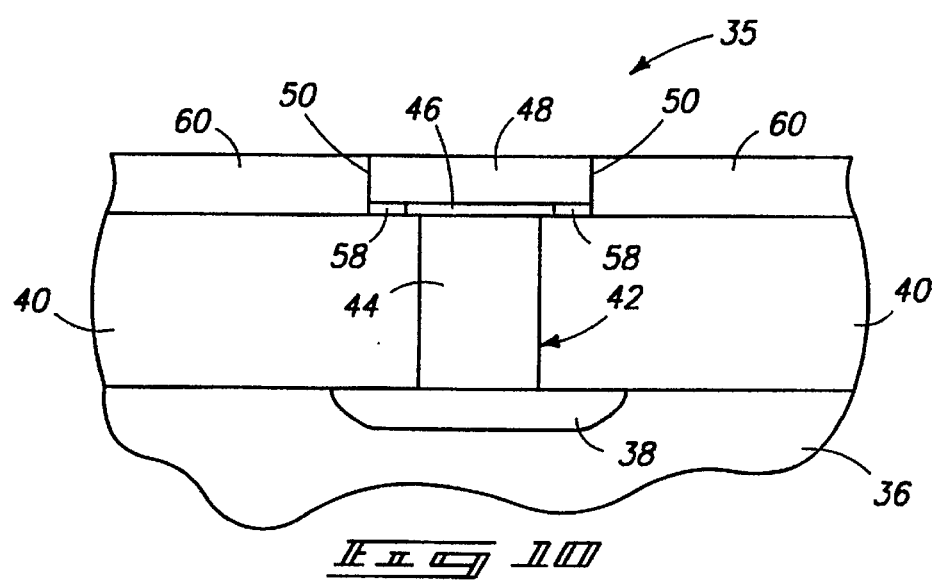
FIG. 10 is a view of the FIG. 3 wafer fragment at a processing step subsequent to that shown by FIG. 9.

Referring to FIG. 10, female molding layer 60 is planarized etched back to outwardly expose etched male molding layer 48. An example and preferred technique is chemical-mechanical polishing, for example utilizing a slurry comprising silica and KOH in deionized water.

Figure 11:
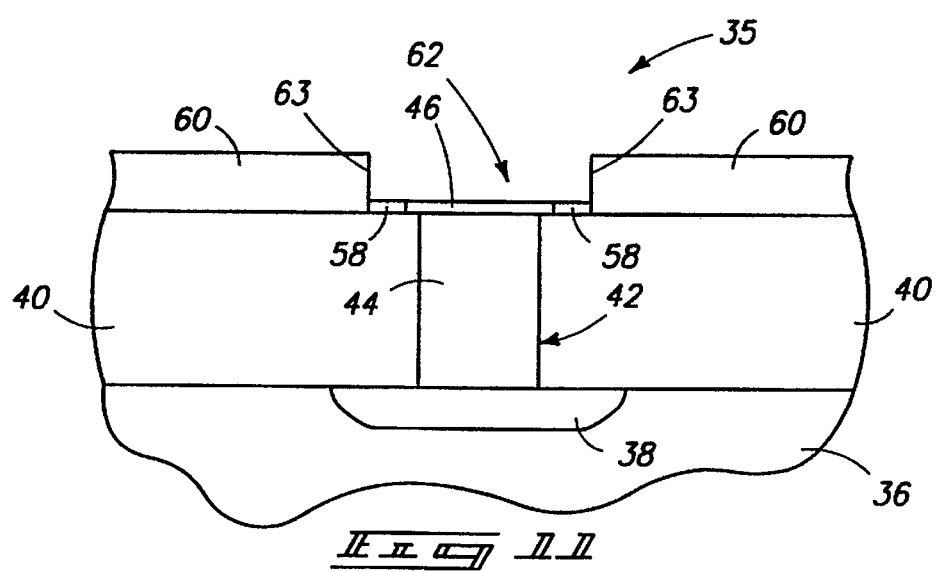
FIG. 11 is a view of the FIG. 3 wafer fragment at a processing step subsequent to that shown by FIG. 10.

Referring to FIGS. 11 and 12, exposed etched male molding layer 48 is stripped from the substrate to leave an open female mold 62 having lateral confines or lateral edges 63 which correspond to that of a desired finished lower capacitor plate shape. Ideally, female mold shape 62 corresponds completely to the external edge confines of the finished lower capacitor plate shape in the provision of adjacent and opposing edges 64 (FIG. 12).

Referring to FIG. 13, a layer of electrically conductive material is deposited atop the wafer and within the female mold. Such is etched back, preferably by chemical-mechanical polishing, to provide a conductive block 66 within the mold. A preferred material for layer 66 is Pt.

Referring to FIG. 14, female molding material 60 is stripped from the substrate to leave electrically conductive block 66 which corresponds in lateral shape to that of a desired finished lower capacitor plate shape. In the described ideal preferred embodiment, such stripping will accordingly define conductive block 66 to correspond completely to the external edge confines of the finished lower capacitor plate shape. An example wet chemistry for stripping material 60 from Pt includes a HF based solution.

Figure 15:
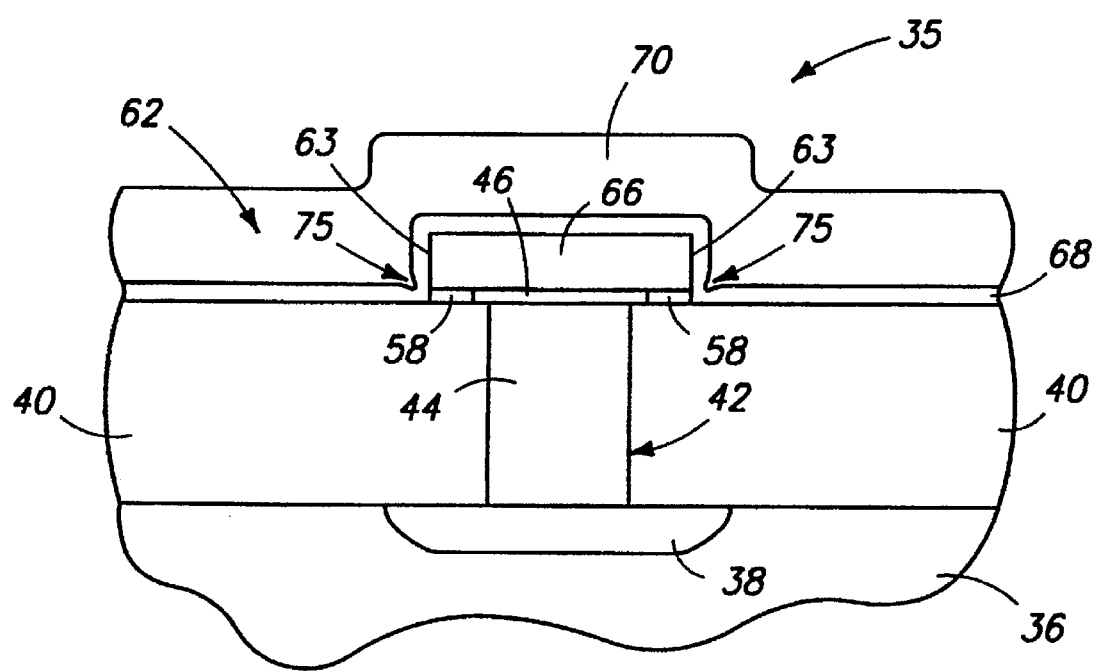
FIG. 15 is a view of the FIG. 3 wafer fragment at a processing step subsequent to that shown by FIG. 13.

Referring to FIG. 15, a capacitor dielectric layer 68 is deposited over the substrate and lower capacitor plate 66.

Such preferably comprises barium strontium titanate. Subsequently, a cell capacitor layer 70 (i.e., platinum) is provided outwardly of cell capacitor layer 68. As will be appreciated by the artisan, oxidation barrier blocks 58 prevent oxidation of reaction barrier layer 46 to prevent the undesired prior art outward wedging of the lower capacitor plate.

Oxidation barrier blocks 58 are preferably also dielectric to assure overall desired capacitance. Specifically, barium strontium titanate as deposited can form sharp cusps or indentations 75 near the oxidation barrier blocks. This effectively reduces the thickness of the dielectric in these regions, and can adversely impact capacitance relative to the lower storage node if oxidation barrier blocks were not made of a dielectric material.

As an alternate process, the described polysilicon layer 48 (FIG. 3) might preferably be substituted to be the desired finished lower capacitor plate material Pt. Accordingly, the step provided in FIG. 4 would etch the electrically conductive lower capacitor plate into a desired external shape having lateral confines corresponding to that of a desired finished lower capacitor plate. The reaction barrier layer would ultimately be etched to form the opposing lateral recesses beneath the etched lower capacitor plate layer. An example chemistry for wet etching TiN selectively relative to Pt to produce the recesses includes $H_2O_2$ and $H_2SO_4$ at a 10:1 ratio by volume, or pure $H_2O_2$. A subsequent oxidation barrier block layer would then be provided and etched to produce a construction corresponding to that of FIG. 8. The steps illustrated by FIGS. 9–13 are thereby eliminated.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A method for forming a capacitor on a substrate having a node, comprising:

forming a reaction barrier layer over the node, the reaction barrier layer having lateral edges;

forming a lower capacitor plate over the reaction barrier layer; and forming oxidation barrier blocks over the lateral edges of the reaction barrier layer.

2. A method as claimed in claim 1, and further comprising:

forming a capacitor dielectric layer over the lower capacitor plate.

3. A method as claimed in claim 1, and further comprising:

forming a dielectric layer comprising barium strontium titanate over the lower capacitor plate.

4. A method as claimed in claim 1, and further comprising:

forming a dielectric layer comprising barium strontium titanate over the inner capacitor plate; and forming an outer capacitor plate over the dielectric layer.

5. A method as claimed in claim 1, wherein the step of forming the reaction barrier layer further comprises:

etching the reaction barrier layer to form opposing lateral recesses beneath the lower capacitor plate layer, the lateral edges of the reaction barrier layer positioned laterally outwardly relative to the node.

6. A method as claimed in claim 1, wherein the step of forming a lower capacitor plate comprises:

etching the lower capacitor plate layer into an external shape having lateral confines corresponding to that of a desired finished lower capacitor plate.

7. A method as claimed in claim 1, wherein the node comprises silicon material, the lower capacitor plate comprises platinum, and the reaction barrier layer comprises titanium nitride.

8. A method of forming a capacitor on a substrate having a node, comprising:

forming a reaction barrier layer over the node;

forming a lower capacitor plate over the reaction barrier layer;

forming oxidation barrier blocks interposed between the substrate and the lower capacitor plate; and forming a layer of barium strontium titanate over the lower capacitor plate.

9. A method as claimed in claim 8, wherein the reaction barrier layer has lateral edges which are recessed beneath the lower capacitor plate, and are disposed laterally outwardly relative to the node.

10. A method as claimed in claim 8, wherein the reaction barrier layer has lateral edges which are recessed beneath the lower capacitor plate, and are disposed laterally outwardly relative to the node, and wherein the oxidation barrier blocks are positioned in covering relation relative to the lateral edges.

11. A method as claimed in claim 8, wherein the oxidation barrier blocks are dielectric.

12. A method as claimed in claim 8, wherein the node comprises a silicon material, the inter capacitor plate comprises platinum, and the reaction barrier layer comprises titanium nitride.

13. A method of forming a capacitor on a substrate having a node, comprising:

forming a reaction barrier layer over the node, the reaction barrier layer having opposing lateral edges;

forming a lower capacitor plate over the reaction barrier layer, the lateral edges of the reaction barrier layer disposed in a recessed position beneath the lower capacitor plate;

forming oxidation barrier blocks over the lateral edges of the reaction barrier layer, the oxidation barrier layer interposed between the substrate and the lower capacitor plate; and forming a layer of barium strontium titanate over the lower capacitor plate.

14. A method of forming a capacitor having inner and outer capacitor plates and a dielectric layer interposed between the inner and outer capacitor plates, the capacitor formed over a substrate having a node, the method comprising:

forming a reaction barrier layer over the substrate and beneath the lower capacitor plate layer, the reaction barrier layer having lateral edges; and forming oxidation barrier blocks over the lateral edges of the reaction barrier layer.

\* \* \* \* \*